(12) United States Patent
Yoshiura et al.

(10) Patent No.: US 12,426,301 B2
(45) Date of Patent: Sep. 23, 2025

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Yasuhiro Yoshiura, Tokyo (JP); Eiko Otsuki, Tokyo (JP); Hayato Okamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 455 days.

(21) Appl. No.: 18/066,818

(22) Filed: Dec. 15, 2022

(65) Prior Publication Data

US 2023/0299191 A1   Sep. 21, 2023

(30) Foreign Application Priority Data

Mar. 15, 2022   (JP) .................. 2022-040353

(51) Int. Cl.
*H10D 30/66* (2025.01)
*H10D 62/10* (2025.01)
*H10D 64/00* (2025.01)

(52) U.S. Cl.
CPC ......... *H10D 30/665* (2025.01); *H10D 62/105* (2025.01); *H10D 64/111* (2025.01)

(58) Field of Classification Search
CPC .................. H10D 8/411; H10D 30/665; H10D 62/105–106
See application file for complete search history.

(56) References Cited

U.S. PATENT DOCUMENTS

| 9,508,870 B2 | 11/2016 | Nishii et al. |
| 2020/0044018 A1 | 2/2020 | Kinpara et al. |
| 2020/0295178 A1* | 9/2020 | Chen ............. H10D 84/811 |

FOREIGN PATENT DOCUMENTS

| JP | 2015-008281 A | 1/2015 |
| JP | 5716865 B2 | 5/2015 |
| JP | 2018-067690 A | 4/2018 |
| JP | 2020-150043 A | 9/2020 |

* cited by examiner

*Primary Examiner* — Daniel P Shook
(74) *Attorney, Agent, or Firm* — Studebaker Brackett PLLC

(57) ABSTRACT

According to the present disclosure, a semiconductor device includes a semiconductor substrate of a first conductivity type, in which a cell region, a ballast resistor region, and a termination region surrounding the ballast resistor region are defined, a first insulating film arranged on a front surface of the semiconductor substrate, having a first opening in the cell region, and having at least one second opening in the ballast resistor region, a second insulating film filled in the at least one second opening, a first impurity layer of a second conductivity type arranged on the front surface of the semiconductor substrate below the first opening, and a second impurity layer of the second conductivity type arranged on the front surface of the semiconductor substrate below the at least one second opening, a conductive film arranged from the front surface of the first opening of the semiconductor substrate to the termination region.

12 Claims, 18 Drawing Sheets

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing the semiconductor device.

Description of the Background Art

In a semiconductor device, the area (contact area) that conducts with a conductive film provided in a cell area does not infinitely extend within a cell area, but is provided at a certain distance from the edge of the outer peripheral portion of the cell area (see, for example, Japanese Patent No. 5716865). With such a configuration, the concentration of carriers is suppressed, where the carriers are returning from directly below the termination section in the semiconductor device to the conductive film arranged on the cell region during the recovery operation. Therefore, suppression of not only current concentration but also heat generation is ensured at the end of the cell region during the recovery operation, thereby improving the breakdown resistance of the semiconductor device.

SUMMARY

However, for forming such a structure described above, there has been a problem of the high manufacturing cost of the semiconductor device because of the requirement of a photomechanical process bath in the step of forming the cell region and in the step of forming a contact area on the cell region.

An object of the present disclosure is to provide a semiconductor device and a method of manufacturing the semiconductor device that reduces manufacturing cost thereof.

According to the present disclosure, a semiconductor device includes a semiconductor substrate of a first conductivity type, in which a cell region, a ballast resistor region which is a region being an outer edge of the cell region, and a termination region surrounding the ballast resistor region are defined, a first insulating film arranged on a front surface of the semiconductor substrate, having a first opening in the cell region, and having at least one second opening in the ballast resistor region, a second insulating film filled in the at least one second opening, a first impurity layer of a second conductivity type arranged on the front surface of the semiconductor substrate below the first opening, and a second impurity layer of the second conductivity type arranged on the front surface of the semiconductor substrate below the at least one second opening, a conductive film arranged from the front surface of the first opening of the semiconductor substrate to the termination region.

According to the present disclosure, the manufacturing is suppressed.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

<Configuration of Related Semiconductor Device>

First, before the semiconductor device according to the embodiments of the present disclosure will be described, a semiconductor device related to a semiconductor device according to the embodiments (hereinafter referred to as "related semiconductor device") will be described. Hereinafter, the case where N-type represents the first conductivity type and P-type represents the second conductivity type will be described. However, the case is not limited thereto, and P-type may represent the first conductivity type and N-type may represent the second conductivity type.

Figure 1:
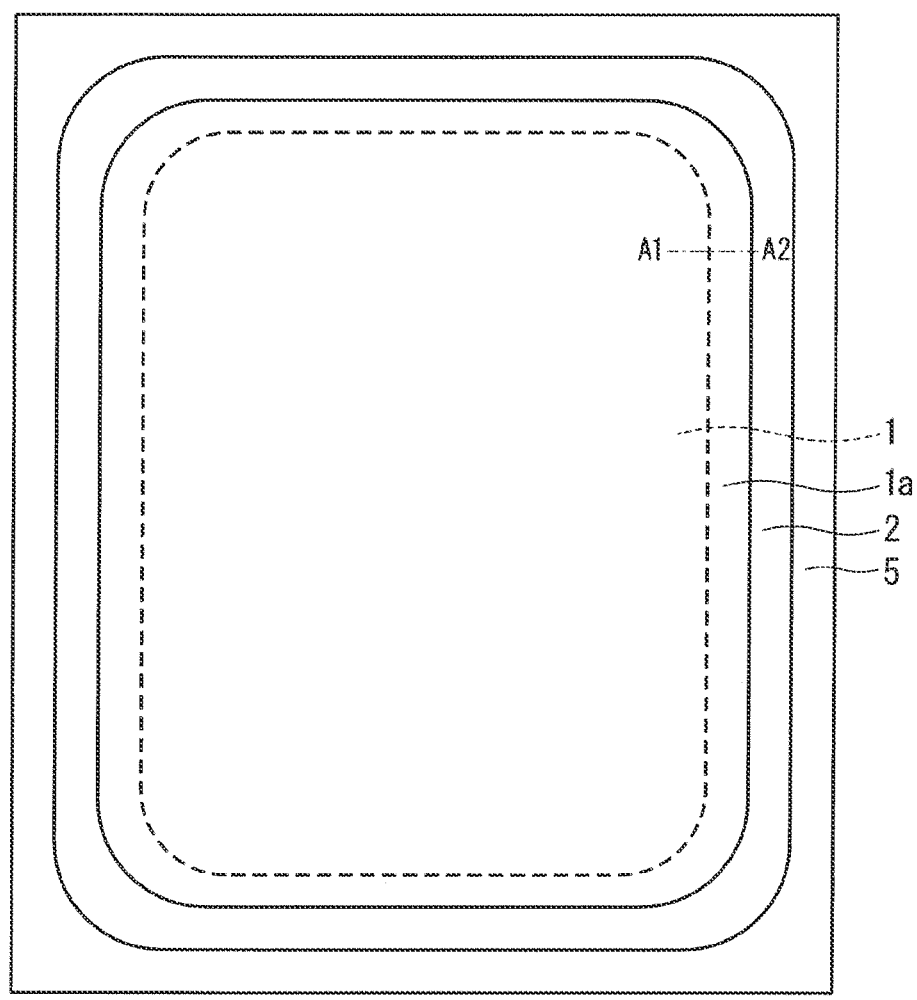
FIG. 1 is a plan view illustrating a configuration of a related semiconductor device.

FIG. 1 is a plan view illustrating a configuration of a related semiconductor device.

As illustrated in FIG. 1, the related semiconductor device includes a semiconductor substrate 5 of N-type. The semiconductor substrate 5 may be composed of a regular semiconductor wafer, or may be composed of an epitaxially grown layer.

In the semiconductor substrate 5, a cell section 1 which is a cell region, a ballast resistor section 1a which is a ballast resistor region, and a termination section 2 which is a termination region are defined. In plan view, the termination section 2 is adjacent to the ballast resistor section 1a which is the outer edge region of the cell section 1, and surrounds the cell section 1 including the ballast resistor section 1a.

At least one of a semiconductor switching element with a built-in diode and a diode (not illustrated) is provided in the cell section 1, for example. In the following, a configuration in which a semiconductor switching element with a built-in diode is provided in the cell section 1 will be described as an example. In such a configuration, the cell section 1 electrically conducts when the semiconductor switching element is in the ON state, and the termination section 2 maintains the breakdown voltage when the semiconductor switching element is in the OFF state, FIG. 2 is a cross-sectional view taken along the line A1-A2 of FIG. 1.

Figure 2:
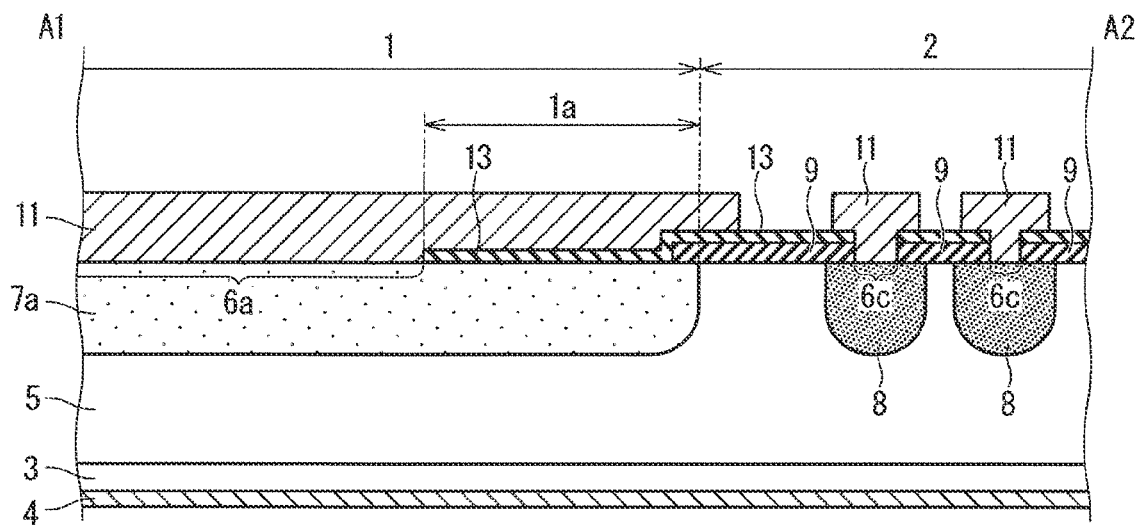
FIG. 2 is a cross-sectional view illustrating a configuration of the related semiconductor device.

As illustrated in FIG. 2, the related semiconductor device includes the semiconductor substrate 5 which is a drift layer, an anode layer 7a, a guard ring layer 8, a first insulating film 9, a front surface electrode 11, a third insulating film 13, an N+ layer 3, and a back electrode 4.

The ballast resistor section 1a is arranged in the outer edge region of the anode layer 7a. The third insulating film 13 is arranged between the ballast resistor section 1a and the front surface electrode 11. That is, the ballast resistor section 1a is insulated from the front surface electrode 11 without being in direct contact therewith.

The termination section 2 is composed of the guard ring layer 8, third openings 6c, and the front surface electrode 11. Note that the termination section 2 is not limited to such a structure, and may have other termination structures such as a Variation of Lateral Doping (VLD) structure or a Reduced Surface Field (RESURF) structure.

The first insulating film 9 is a thermal oxide film, for example, and is arranged on the front surface of the semiconductor substrate 5.

The third insulating film 13 is arranged from a portion of the anode layer 7a over the first insulating film 9. Although the example of FIG. 2 illustrates the case where the third insulating film 13 is a deposited oxide film, the third insulating film 13 may also be a thermal oxide film. In a case where the third insulating film 13 is a thermal oxide film, there is no distinction between the first insulating film 9 and the third insulating film 13.

The third insulating film 13 has a first opening 6a on the anode layer 7a. In other words, of the semiconductor substrate 5, the front surface corresponding to the first opening 6a is provided with the anode layer 7a which is a first impurity layer of P+ type.

The front surface electrode 11, which is a conductive film, is electrically conducted with the anode layer 7a through the first opening 6a. An end portion of the front surface electrode 11 is arranged to extend from the cell section 1 into the termination section 2.

Figure 3:
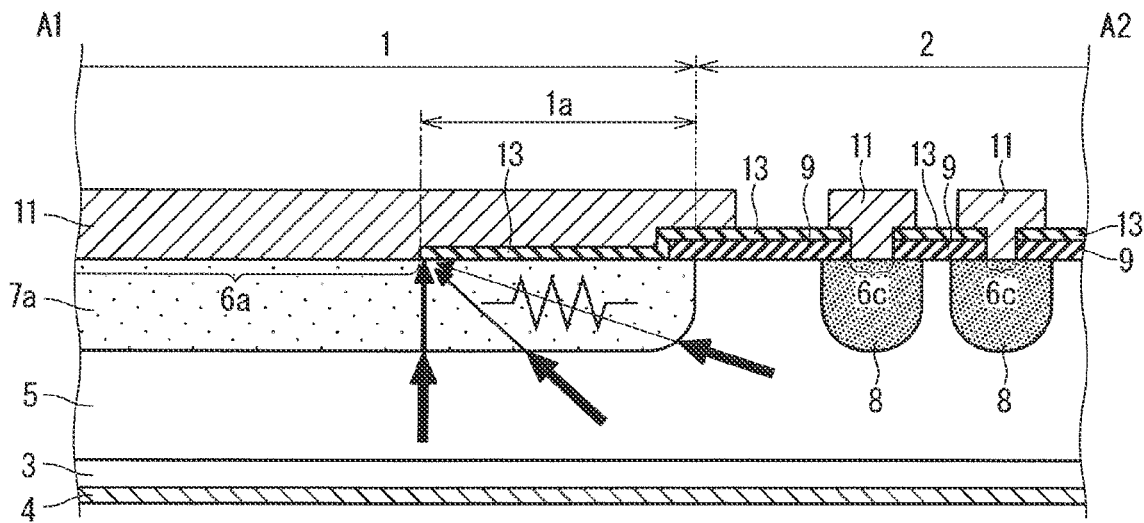
FIG. 3 is a cross-sectional view illustrating movement of residual carriers in the related semiconductor device during recovery operation.

FIG. 3 is a cross-sectional view illustrating movement of residual carriers in the related semiconductor device during recovery operation;

When the semiconductor switching element provided in the cell section 1 is in the ON state, carriers are accumulated in the cell section 1 and the termination section 2. Then, when the semiconductor switching element enters into the recovery state, residual carriers in the semiconductor device move toward the front surface electrode 11 serving as an anode.

In the related semiconductor device, the ballast resistor section 1a is arranged to suppress heat generation caused by concentration of residual carriers. The ballast resistor section 1a is a region insulated from the front surface electrode 11 by the third insulating film 13, and is arranged on the outer edge of the anode layer 7a. The ballast resistor section 1a thus configured serves as a resistor (ballast resistor) against the internal current during the recovery operation; therefore, not only the internal current but also the heat generation can be suppressed, increasing the recovery breakdown resistance.

<Method of Manufacturing Related Semiconductor Device>

A method of manufacturing the related semiconductor device will be described. FIGS. 4 to 13 are cross-sectional views illustrating the method of manufacturing the related semiconductor device.

Figure 4:
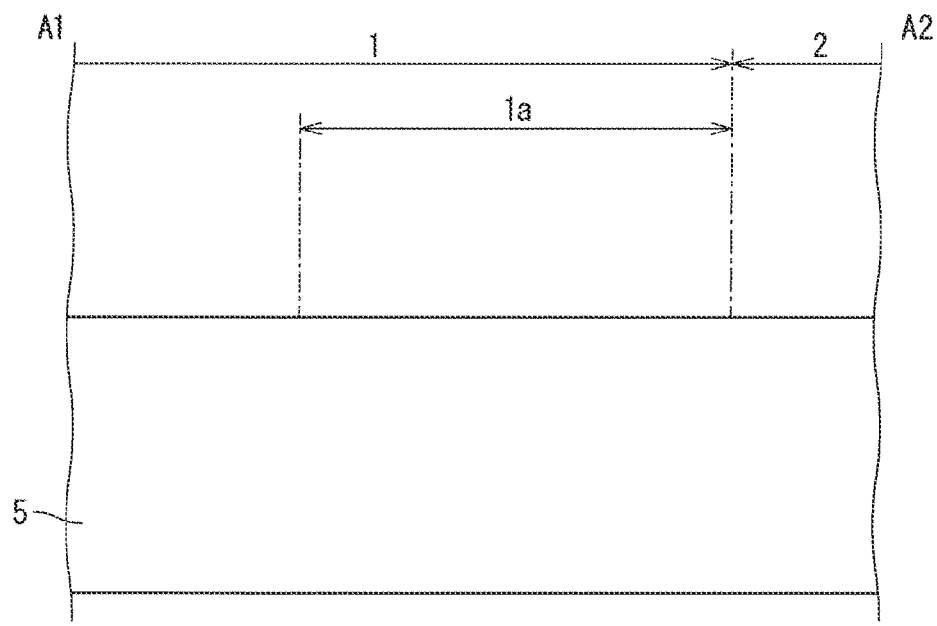
FIG. 4 is a cross-sectional view illustrating a method of manufacturing the related semiconductor device.

First, a semiconductor substrate 5 is prepared as illustrated in FIG. 4.

Figure 5:
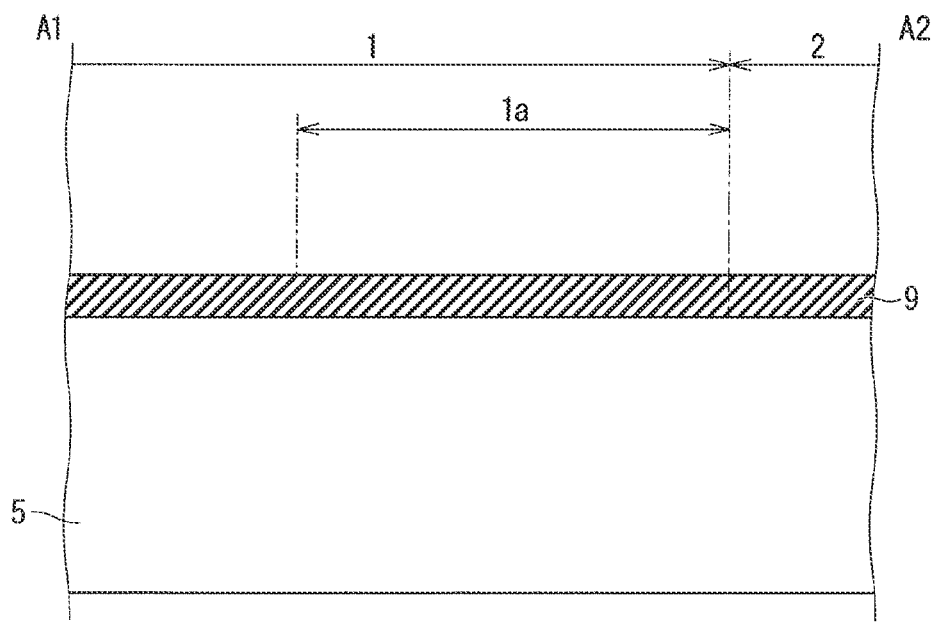
FIG. 5 is a cross-sectional view illustrating a method of manufacturing the related semiconductor device.

Next, the first insulating film 9 is formed on the front surface of the semiconductor substrate 5 as illustrated in FIG. 5. As a method of forming the first insulating film 9, an example, such as a method of forming the first insulating film 9 by heating the semiconductor substrate 5, or a method of depositing or coating an insulating material on the front surface of the semiconductor substrate 5, is given.

Figure 6:
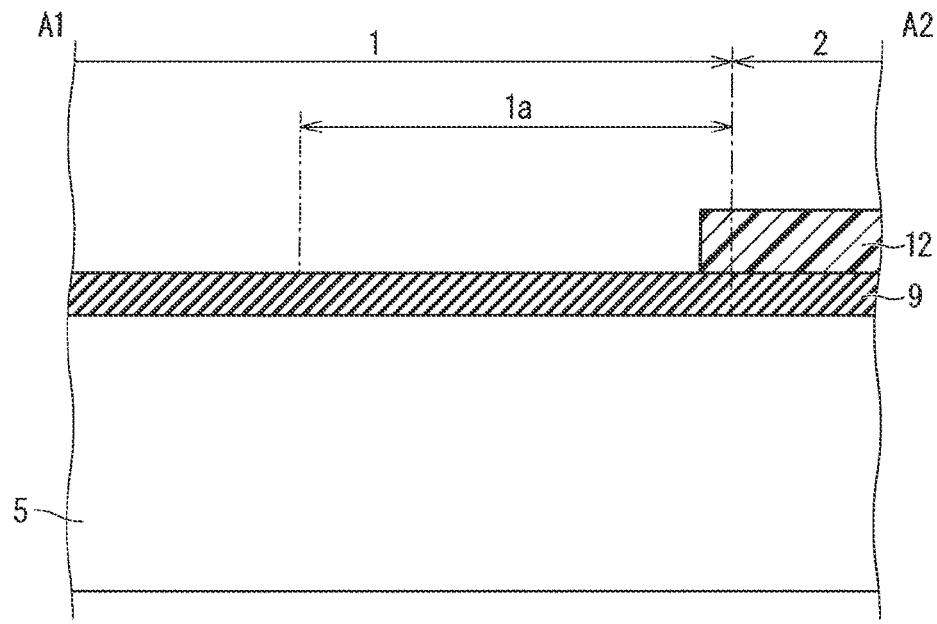
FIG. 6 is a cross-sectional view illustrating a method of manufacturing the related semiconductor device.

Next, as illustrated in FIG. 6, a first resist film 12 is patterned on the first insulating film 9 by performing the first round of the photomechanical process.

Figure 7:
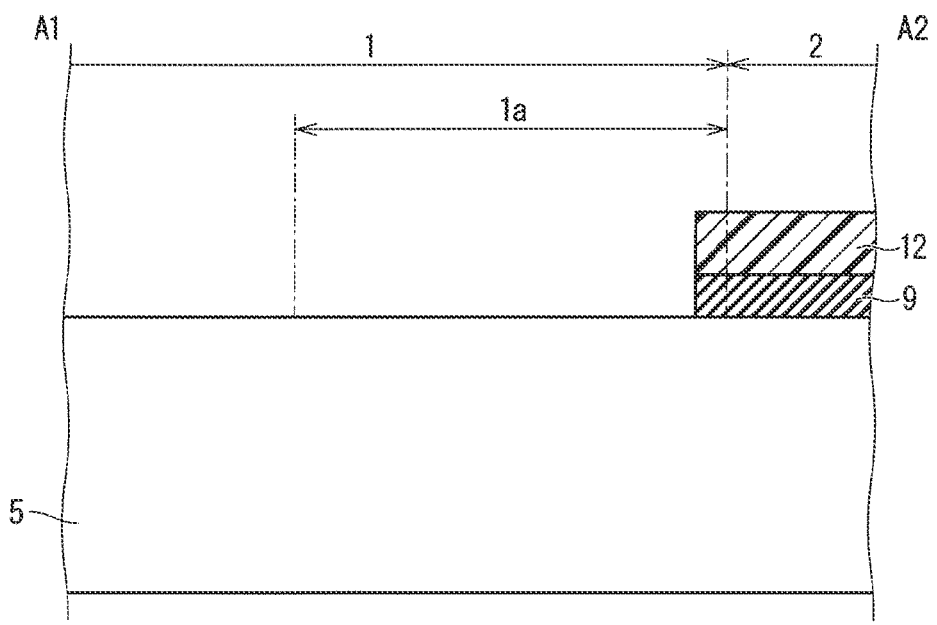
FIG. 7 is a cross-sectional view illustrating a method of manufacturing the related semiconductor device.

Next, as illustrated in FIG. 7, the first insulating film 9 is selectively etched using the patterned first resist film 12, Thereby, the first insulating film 9 is partially removed.

Figure 8:
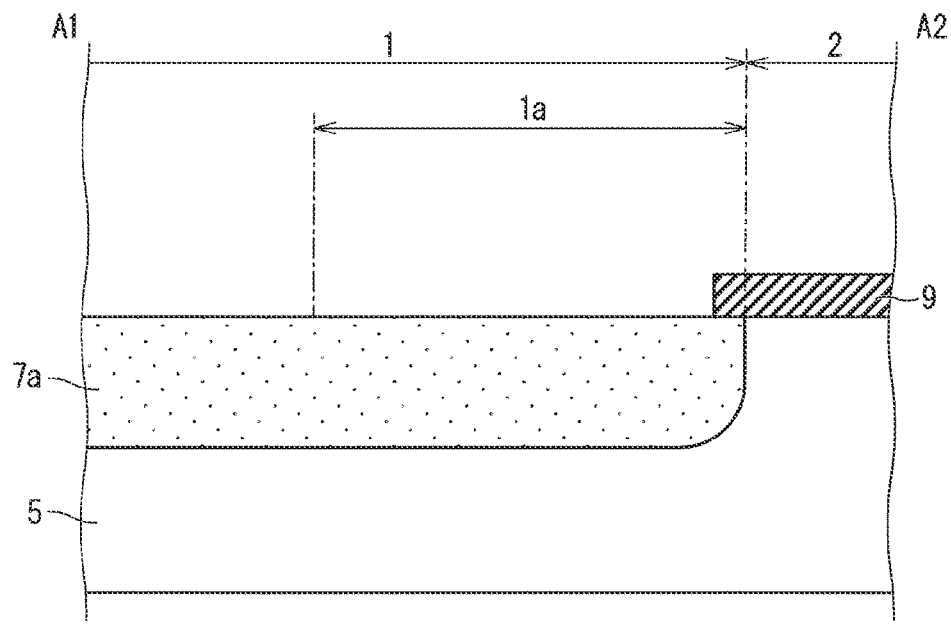
FIG. 8 is a cross-sectional view illustrating a method of manufacturing the related semiconductor device.

Next, as illustrated in FIG. 8, after removing the first resist film 12, impurities are implanted or deposited in the opening of the first insulating film 9. Then, the anode layer 7a is formed by activating and diffusing impurities at a high temperature.

Figure 9:
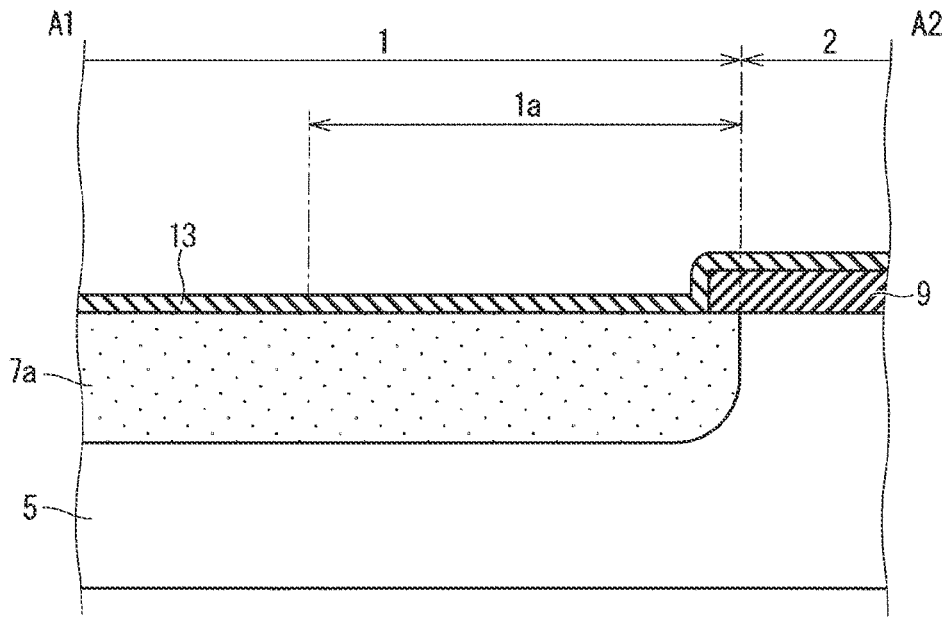
FIG. 9 is a cross-sectional view illustrating a method of manufacturing the related semiconductor device.

Next, as illustrated in FIG. 9, a third insulating film 13 is formed over the anode layer 7a in the opening of the first insulating film 9 and across the first insulating film 9. Although the example of FIG. 9 illustrates a method of forming the third insulating film 13 with a deposited oxide film, the third insulating film 13 may be formed with a thermal oxide film.

Figure 10:
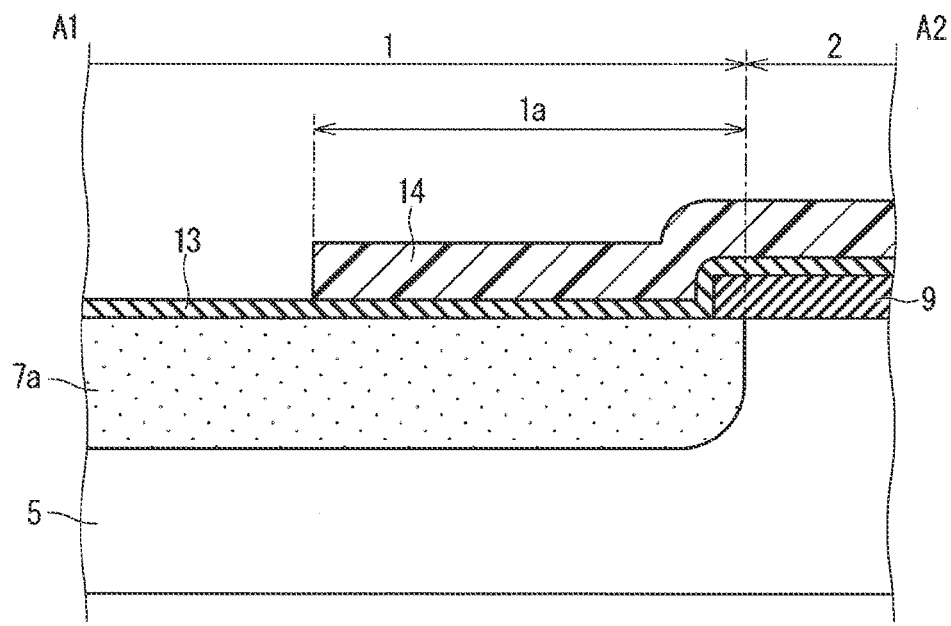
FIG. 10 is a cross-sectional view illustrating a method of manufacturing the related semiconductor device.

Next, as illustrated in FIG. 10, a second resist film 14 is patterned on the third insulating film 13 by performing the second round of the photomechanical process. At this point, the pattern width of the second resist film 14 corresponding to the width of the ballast resistor section 1a (the width in the horizontal direction of the paper sheet of FIG. 10) is a parameter for controlling the ballast resistance value, and is in a contradictory relationship with the opening area of the third insulating film 13. Therefore, the pattern width of the second resist film 14 corresponding to the width of the ballast resistor section 1a, is to be designed in view of the trade-off between the conduction performance and the recovery breakdown resistance.

Figure 11:
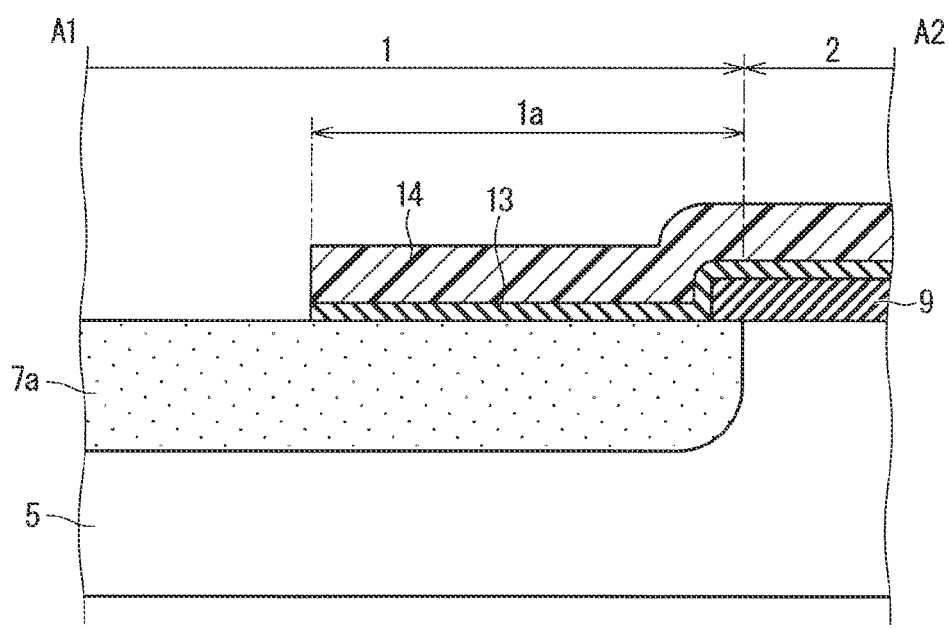
FIG. 11 is a cross-sectional view illustrating a method of manufacturing the related semiconductor device.

Next, as illustrated in FIG. 11, the third insulating film 13 is selectively etched using the patterned second resist film 14. Thereby, the third insulating film 13 is partially removed.

Figure 12:
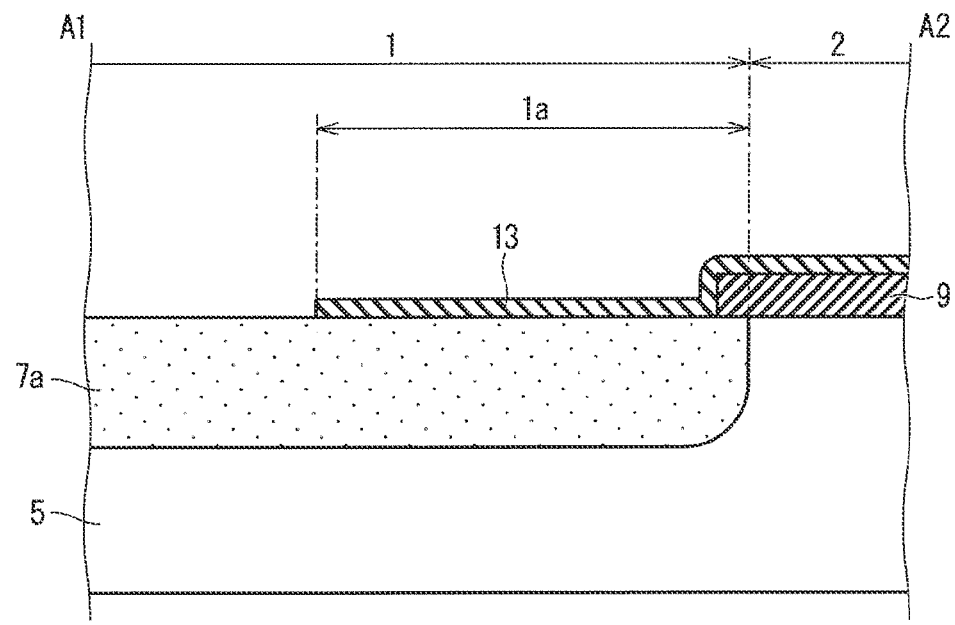
FIG. 12 is a cross-sectional view illustrating a method of manufacturing the related semiconductor device.

Next, as illustrated in FIG. 12, the second resist film 14 is removed.

Figure 13:
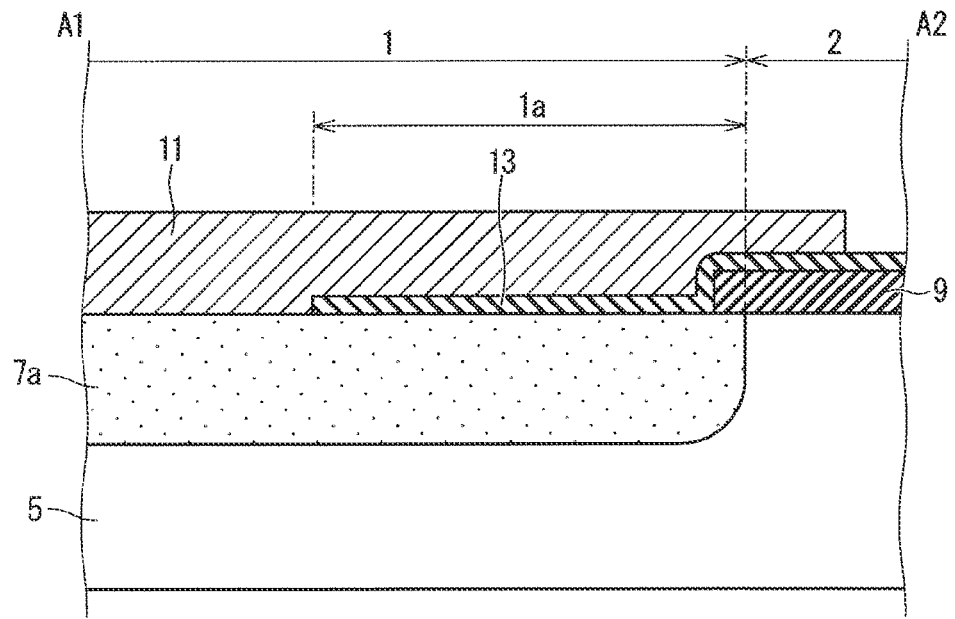
FIG. 13 is a cross-sectional view illustrating a method of manufacturing the related semiconductor device.

Next, as illustrated in FIG. 13, after forming the front surface electrode 11 which is a conductive film, desired patterning is performed. Examples of film formation methods for the front surface electrode 11 include deposition, vapor deposition, plating, and sputtering. As a result, the end portion of the front surface electrode 11 electrically conducted with the anode layer 7a is arranged to extend from the cell section 1 to part of the termination section 2. Arranging the front surface electrode 11 exerts the field plate effect, improving the main breakdown voltage of the semiconductor device.

Subsequent manufacturing flow includes forming an overcoat film on the front surface, forming an N+ layer 3 which is an impurity layer on the back surface side of the semiconductor substrate 5, and forming the back electrode 4, thereby, completing the related semiconductor device.

In order to form the ballast resistor section 1a in the manufacturing processing of the related semiconductor device described above, a dedicated mask used in the second round of the photomechanical process illustrated in FIG. 10 is required, and the dedicated processes of the photomechanical process and processing illustrated in FIGS. 11 and 12 are also required. As a result, there is a problem that the manufacturing cost of the semiconductor device increases. Meanwhile, embodiments described below solve such a problem.

First Embodiment

Configuration of Semiconductor Device of First Embodiment

Figure 14:
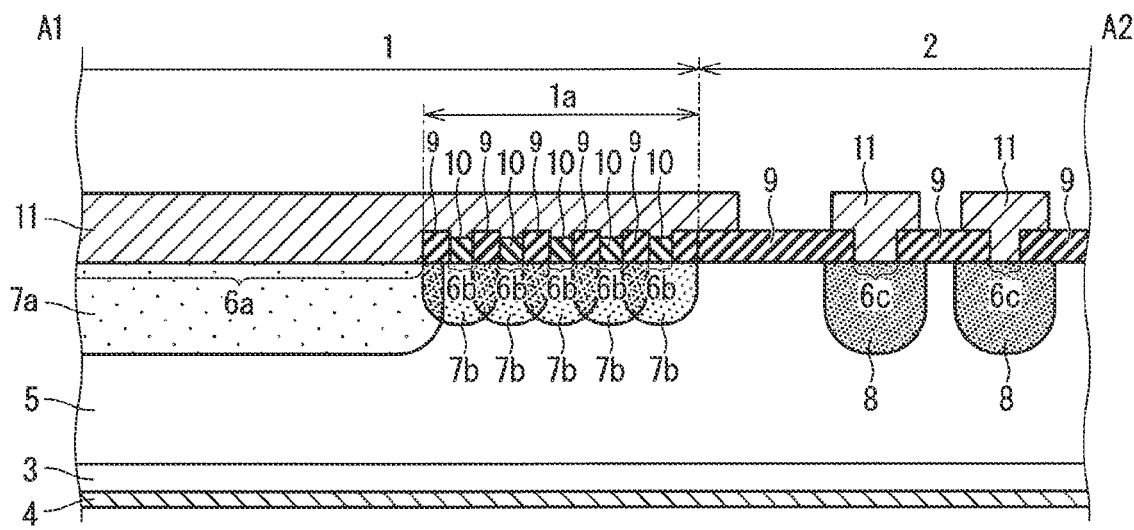
FIG. 14 is a cross-sectional view illustrating a configuration a semiconductor device according to a first embodiment.

FIG. 14 is a cross-sectional view illustrating a configuration of a semiconductor device according to a first embodiment. The cross-sectional view illustrated in FIG. 14 corresponds to the cross-sectional view illustrated in FIG. 2. Hereinafter, among the components of the semiconductor device according to the first embodiment, components that are the same or similar to the components as those described above are denoted by the same or similar reference numerals, and different components will be mainly described.

As illustrated in FIG. 14, the first insulating film 9 arranged in the region corresponding to the ballast resistor section 1a has a plurality of second openings 6h. A second insulating film 10 is filled in each of the second openings 6b. With this, in the ballast resistor section 1a, the semiconductor substrate 5 is electrically insulated from the front surface electrode 11 connected to the anode layer 7a through the first opening 6a.

A plurality of multiple diffusion layers 7b, which are second impurity layers of P-type, are arranged at each of the second openings 6b on the semiconductor substrate 5 side. Each multiple diffusion layer 7b is in contact with each other and is also in contact with the anode layer 7a. That is, the multiple diffusion layers 7b are adjacent to each other, and the multiple diffusion layer 7b closest to the anode layer 7a among the multiple diffusion layers 7b is in contact with the anode layer 7a.

Figure 15:
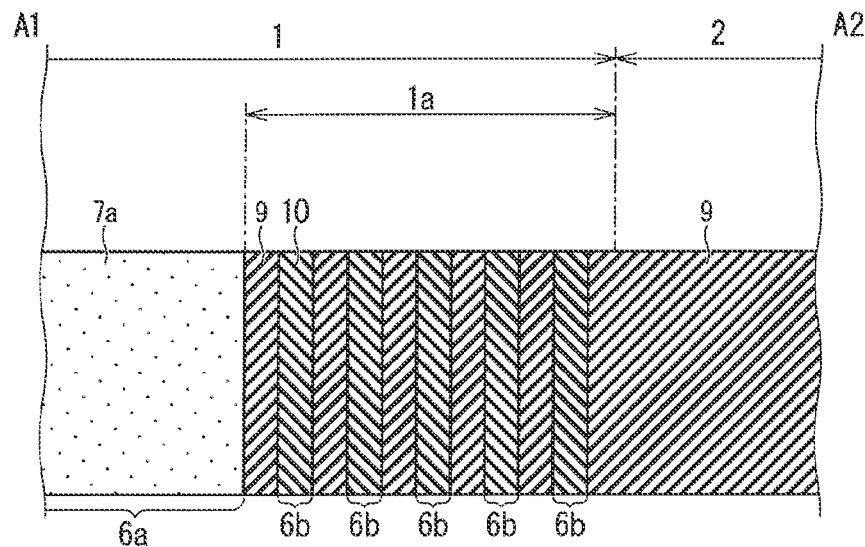
FIG. 15 is a plan view illustrating the configuration of the semiconductor device according to the first embodiment.

FIG. 15 is a plan view illustrating the first opening 6a and the second openings 6b. In the example of FIG. 15, the first opening 6a lies in no pattern in particular, and the second openings 6b are aligned in a striped pattern.

Method of Manufacturing Semiconductor Device of First Embodiment

A method of manufacturing the semiconductor device according to the first embodiment will be described. FIGS. 16 to 23 are cross-sectional views illustrating the method of manufacturing the semiconductor device according to the first embodiment.

Figure 16:
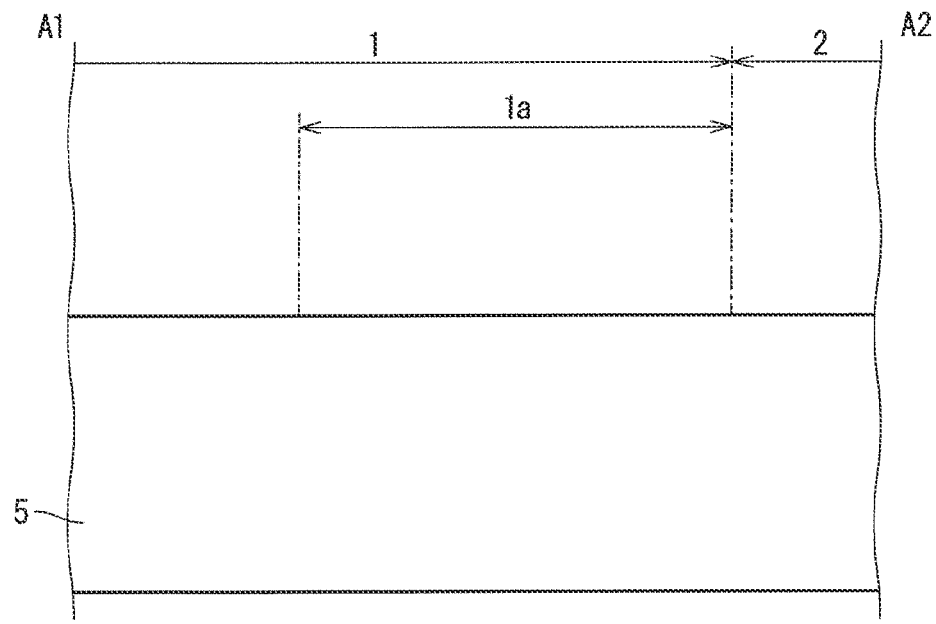
FIG. 16 is a cross-sectional view illustrating the configuration of the semiconductor device according to the first embodiment.

First, as illustrated in FIG. 16, a semiconductor substrate 5 is prepared as in the related semiconductor device.

Figure 17:
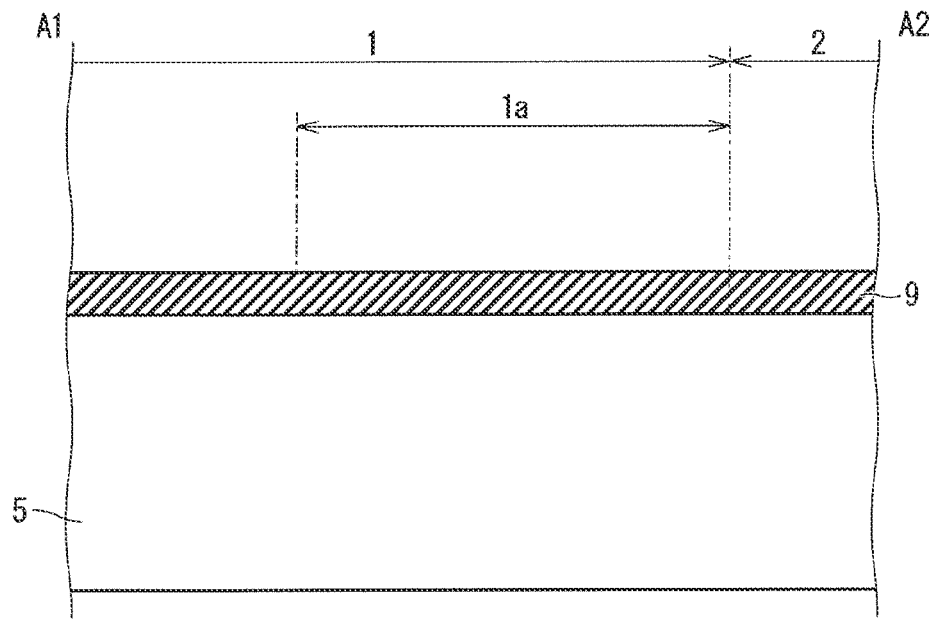
FIG. 17 is a cross-sectional view illustrating a method of manufacturing the semiconductor device according to the first embodiment.

Next, as illustrated in FIG. 17, a first insulating film 9 is formed on the front surface of the semiconductor substrate 5 as in the related semiconductor device. As a method of forming the first insulating film 9, an example, such as a method of forming the first insulating film 9 by heating the semiconductor substrate 5, or a method of depositing or coating an insulating material on the front surface of the semiconductor substrate 5, is given.

Figure 18:
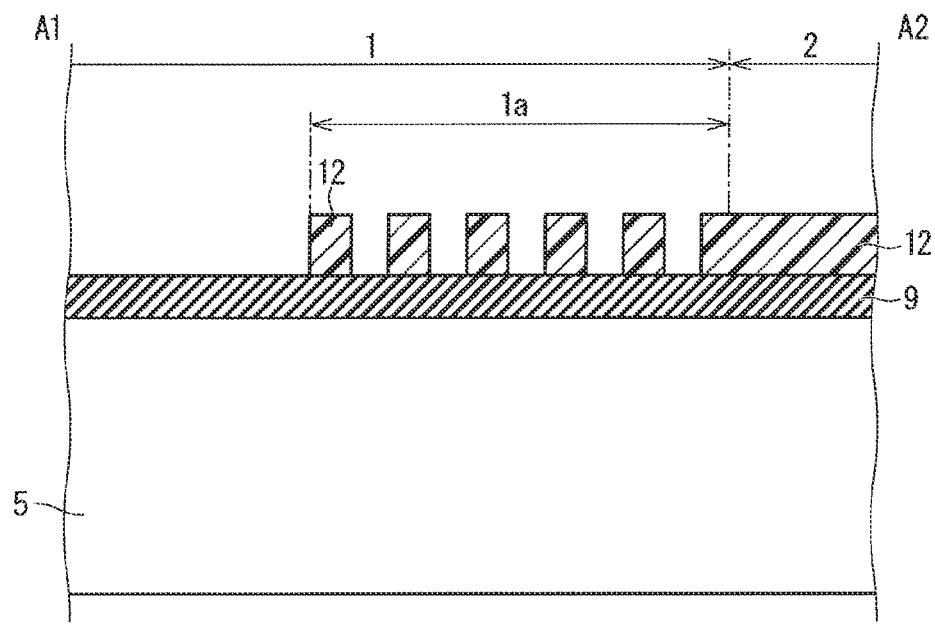
FIG. 18 is a cross-sectional view illustrating the method of manufacturing the semiconductor device according to the first embodiment.

Next, as illustrated in FIG. 18, a first resist film 12 is patterned on the first insulating film 9 by performing the first round of the photomechanical process. At this point, unlike the related semiconductor device, patterning of the first resist film 12 is performed so that the stripe-shaped second openings 6b illustrated in FIG. 15 are formed in the region corresponding to the ballast resistor section 1a.

Figure 19:
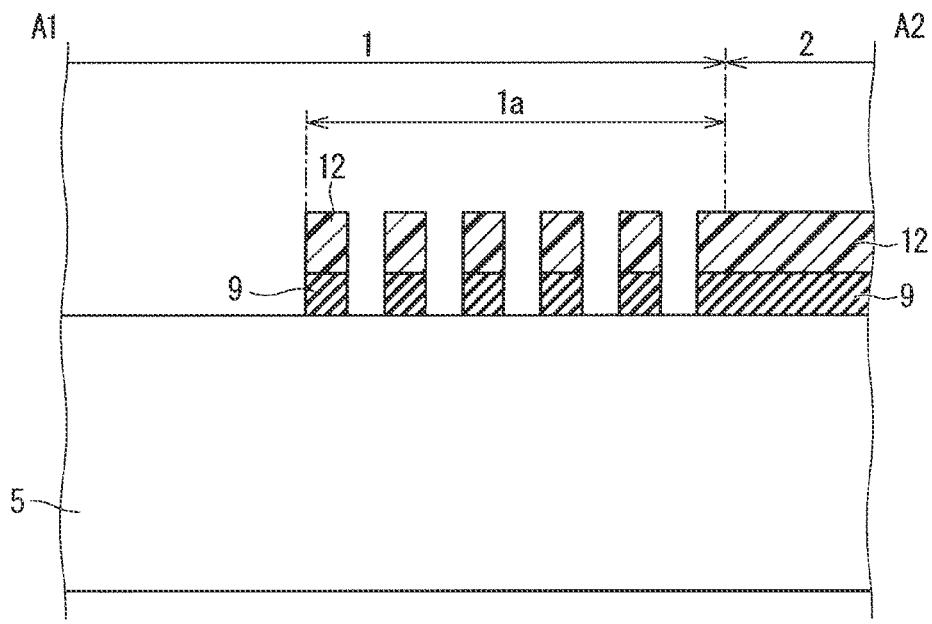
FIG. 19 is a cross-sectional view illustrating the method of manufacturing the semiconductor device according to the first embodiment.

Next, as illustrated in FIG. 19, the first insulating film 9 is selectively etched using the patterned first resist film 12. Thereby, the first insulating film 9 is partially removed.

Figure 20:
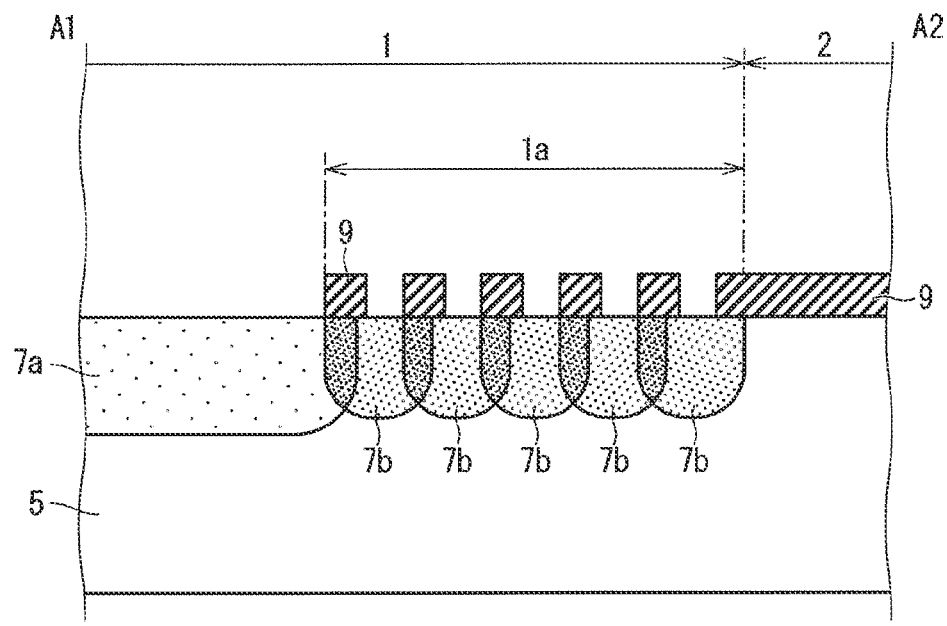
FIG. 20 is a cross-sectional view illustrating the method of manufacturing the semiconductor device according to the first embodiment.

Next, as illustrated in FIG. 20, after removing the first resist film 12, impurities are implanted or deposited in the first opening 6a and the second openings 6b of the first insulating film 9 as in the related semiconductor device. After that, the anode layer 7a and the multiple diffusion layers 7b are simultaneously formed by activating and diffusing the impurities at a high temperature. At this time, the pattern of the first resist film 12 illustrated in FIG. 19 needs to be designed in consideration of the lateral diffusion width proportional to the diffusion depth, such that the multiple diffusion layers 7b are in contact with each other, and the multiple diffusion layers 7b and the anode layer 7a are in contact with each other.

Figure 21:
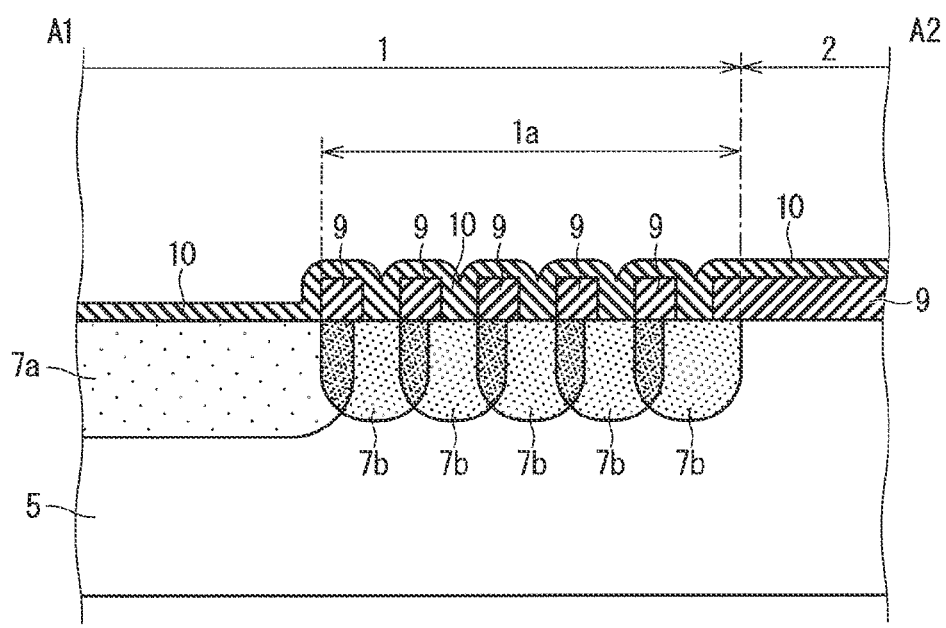
FIG. 21 is a cross-sectional view illustrating the method of manufacturing the semiconductor device according to the first embodiment.

Next, as illustrated in FIG. 21, the second insulating film 10 is formed to fill the second openings 6b on each multiple diffusion layer 7b. The second insulating film 10 needs to be filled up to the top of the second openings 6b. A method for forming the second insulating film 10 is a deposition method. When the second openings 6h are filled with the second insulating film 10, the second insulating film 10 is inevitably formed also in the first opening 6a.

Figure 22:
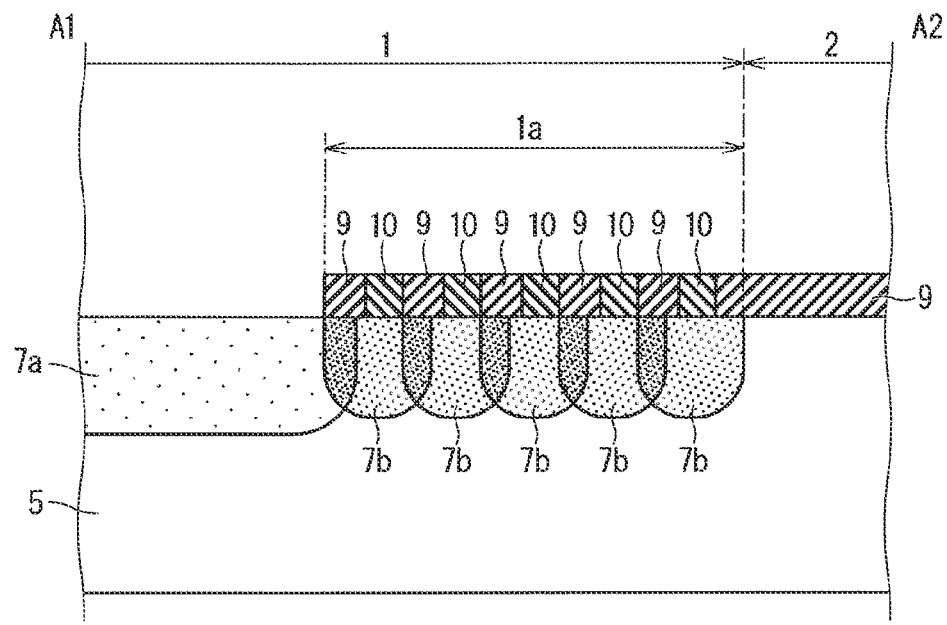
FIG. 22 is a cross-sectional view illustrating the method of manufacturing the semiconductor device according to the first embodiment.

Next, as illustrated in FIG. 22, the entire surface is etched. The amount of etching at this point is the minimum amount of etching that removes the second insulating film 10 formed in the first opening 6a.

Figure 23:
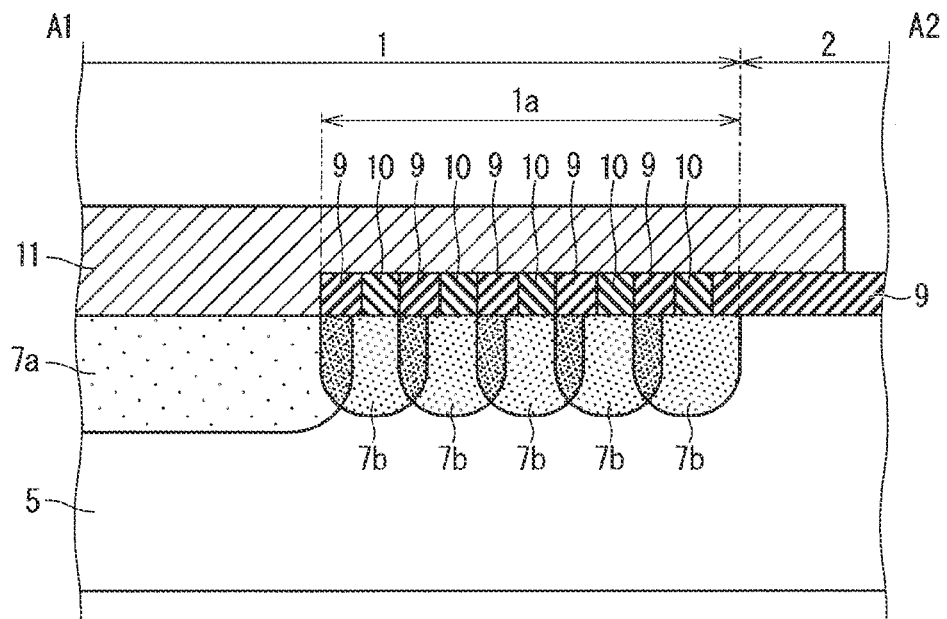
FIG. 23 is a cross-sectional view illustrating the method of manufacturing the semiconductor device according to the first embodiment.

Next, as illustrated in FIG. 23, after forming the front surface electrode 11 which is a conductive film, desired patterning is performed. Examples of film formation methods for the front surface electrode 11 include deposition, vapor deposition, plating, and sputtering. As a result, the end portion of the front surface electrode 11 electrically conducted with the anode layer 7a is arranged to extend from the cell section 1 to part of the termination section 2. Arranging the front surface electrode 11 exerts the field plate effect, improving the main breakdown voltage of the semiconductor device.

Also, the first insulating film 9 and the second insulating film 10 provided in the region corresponding to the ballast resistor section 1a must insulate the front surface electrode 11 from the multiple diffusion layers 7h. Therefore, when performing the etching illustrated in FIG. 22, the second openings 6b need to be sufficiently densely filled with the second insulating film 10. To this end, the pattern of the first resist film 12 in the ballast resistor section 1a illustrated in FIG. 19 needs to be designed in consideration of the thickness and deposition conditions of the second insulating film 10.

Subsequent manufacturing flow includes forming an overcoat film on the front surface, forming an N+ layer 3 which is an impurity layer on the back surface side of the semiconductor substrate 5, and forming the back electrode 4, thereby, completing the semiconductor device of the first embodiment.

Summary of First Embodiment

According to the semiconductor device according to the first embodiment, the dedicated mask for forming the anode layer 7a and the dedicated mask for conducting the anode layer 7a and the front surface electrode 11, which were necessary when manufacturing the related semiconductor device, are integrated into one dedicated mask. In addition, one set of dedicated processes for the photomechanical process and processing can be omitted. Therefore, the manufacturing cost of the semiconductor device can be suppressed.

In addition, as explained in FIGS. 20 and 23 above, in the semiconductor device according to the first embodiment, the pattern design of the ballast resistor section 1a needs to be determined in consideration of the depth of formation of the anode layer 7a and the thickness and deposition conditions of the second insulating film 10. Also, the pattern design of the ballast resistor section 1a needs to be determined in consideration of the overall width of the multiple diffusion layers 7b and the overall concentration of the multiple diffusion layers 7b in the ballast resistor section 1a, which are effective for recovery breakdown resistance.

The whole of the multiple diffusions layers 7b is inevitably shallower than the anode layer 7a and has a lower impurity concentration. This contributes to the aperture ratio of the second openings 6b, that is, the ratio of the sum of the areas of the second openings 6b to the area of the ballast resistor section 1a.

The formation conditions of the anode layer 7a, that is, the impurity introduction amount, activation, and diffusion conditions also control the main electrical characteristics of the semiconductor device according to the first embodiment, which are not described here. Therefore, the formation conditions of the anode layer 7a need to be designed in a well-balanced manner with the structure of the multiple diffusion layers 7b.

Figure 24:
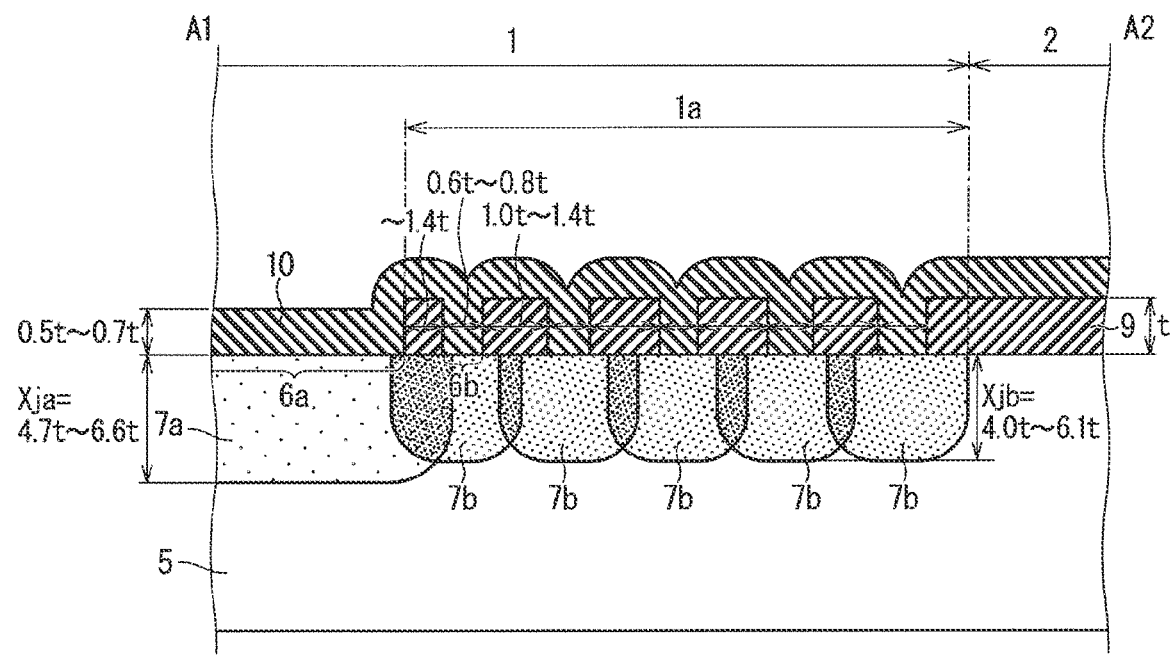
FIG. 24 is a cross-sectional view illustrating a recommended design ration of the semiconductor device according to the first embodiment.

For example, as illustrated in FIG. 24, when the thickness of the first insulating film 9 is set to the variable t (reference) and the depth Xja of the anode layer 7a is set to 4.7 t to 6.6 t, the thickness of the deposited second insulating film 10 is set to 0.5 t to 0.7 t, the opening width of the second opening 6b in the ballast resistor section 1a is set to 0.6 t to 0.8 t, the second openings 6b are aligned at equal intervals of 1.0 t to 1.4 t, and the gap between the first opening 6a and the second opening 6b is 1.4 t or less. As a result, the entire surface of the second openings 6b is filled with the second insulating film 10, the multiple diffusion layers 7b are brought into contact with each other, and the multiple diffusion layer 7b and the anode layer 7a are brought into contact with each other. At this point, the depth Xjb of the multiple diffusion layers 7b is 4.0 t to 6.1 t, and the concentration reduction rate of the entire multiple diffusion layers 7b to the anode layer 7a is 50 to 73%.

First Modification Example

In the first embodiment, FIG. 15 illustrates an example of the first opening 6a and the second openings 6b. However, the pattern shape of the second openings 6b is not limited thereto, as long as it is configured such that the entire surface of the second openings 6b is filled with the second insulating film 10, the multiple diffusion layers 7b are brought into contact with each other, and the multiple diffusion layer 7b and the anode layer 7a are brought into contact with each other.

Although FIG. 15 illustrates a case where five bars, which are formed with a striped pattern, represent the second openings 6b, as long as the above conditions are satisfied, the number of bars with a striped pattern is not limited thereto, and the width of the second opening 6b and the width between the second openings 6b and are also not limited.

Figure 25:
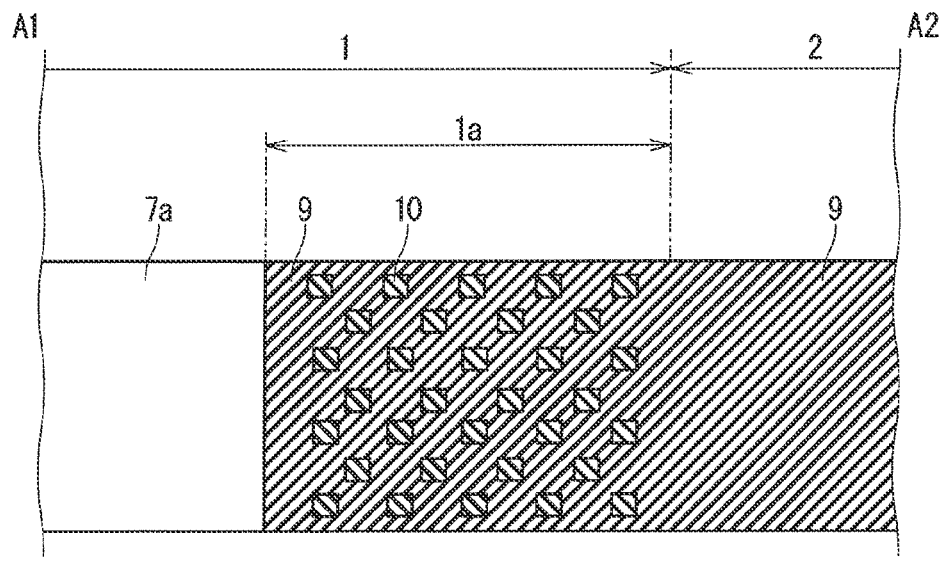
FIG. 25 is a plan view illustrating a configuration of a semiconductor device according to a first modification example of the first embodiment.

For example, as illustrated in FIG. 25, the second openings 6b may be formed in a dot pattern in plan view. Also, the shape of the dot may be circular or polygonal.

FIGS. 15 and 25 illustrate the case where the second openings 6b are arranged at regular intervals. However, as long as the above conditions are satisfied, the second openings 6h may not be arranged at equal intervals, and may be arranged unevenly locally.

The first modification example is applicable to other embodiments other than the first embodiment.

Second Modification Example

Figure 26:
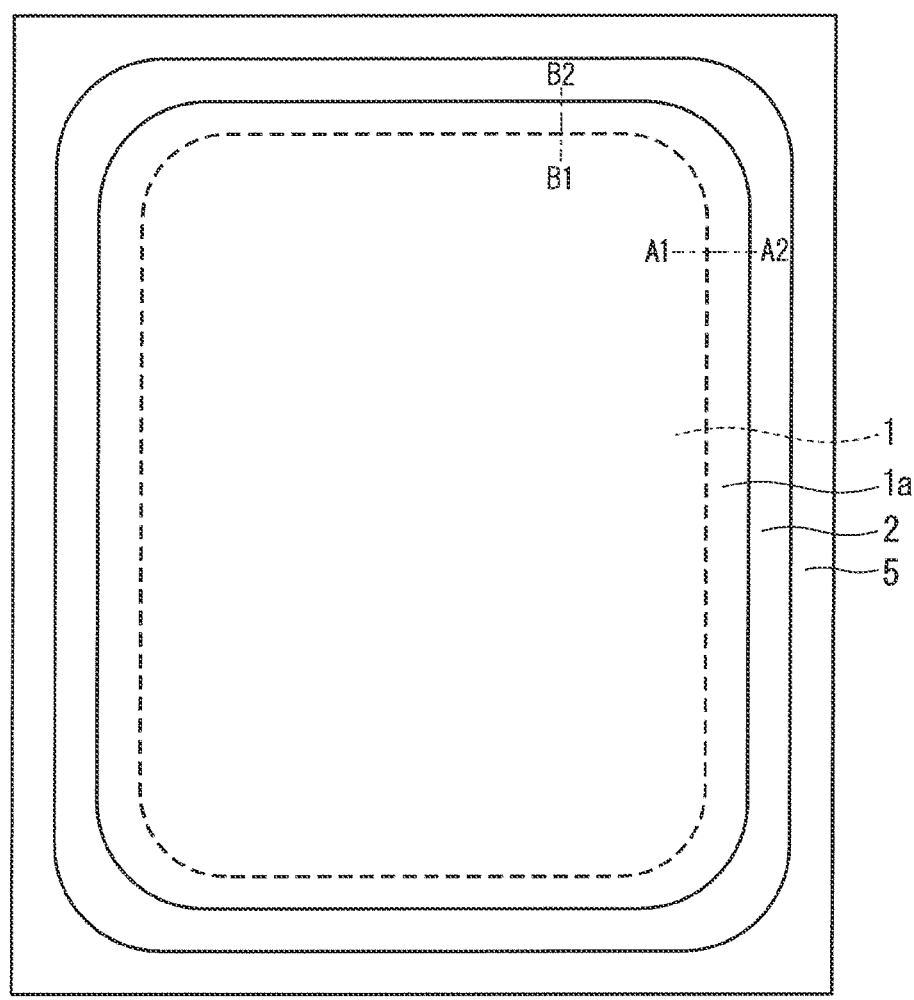
FIG. 26 is a plan view illustrating a configuration of a semiconductor device according to second and third modification examples of the first embodiment.

FIG. 26 is a plan view in which line B1-B2 is added to FIG. 1 in order to describe a second modification.

In the first embodiment, the description has been made where the recovery breakdown resistance is improved using the ballast resistor section 1a. The concentration of the recovery current, which is to be considered when determining the recovery breakdown resistance, is greatest at the corner portions of the semiconductor device. In order to alleviate the concentration of recovery current, the resistance of the ballast resistor section 1a at the corner portion is to be increased. In order to increase the resistance of the ballast resistor section 1a at the corner portion, the impurity concentration of the multiple diffusion layers 7b at the corner portion is to be lowered.

Figure 27:
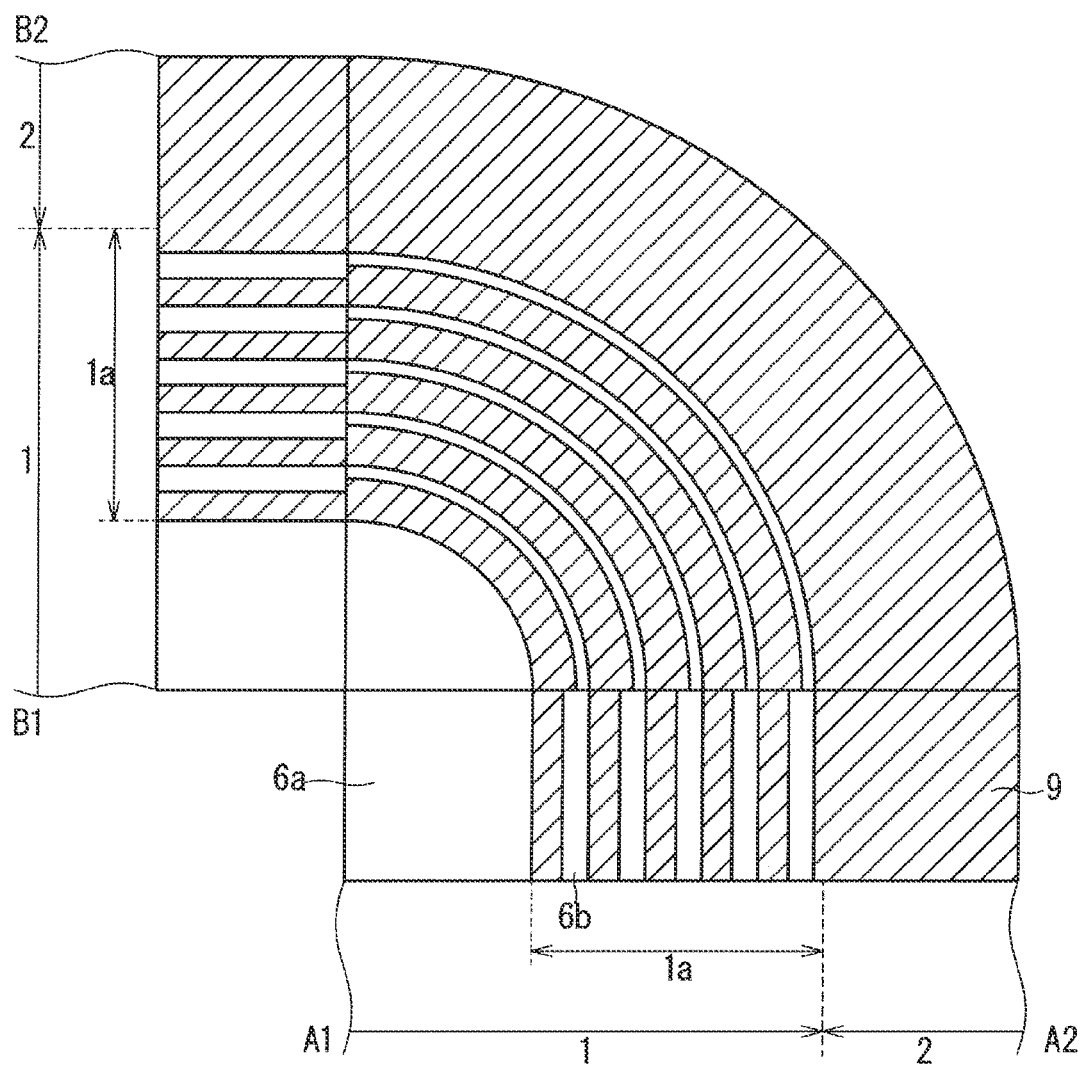
FIG. 27 is a plan view illustrating the configuration of the semiconductor device according to the second modification example of the first embodiment.

As illustrated in FIG. 27, the area (width) of the second opening 6b at the corner portion is smaller than the area (width) of the second opening 6b at the portion other than the corner portion. Consequently, the impurity concentration of the multiple diffusion layers 7b at the corner portion can be lowered.

Although FIG. 27 illustrates a schematic diagram for ease of description, smoothing processing to smoothen the corners is actually required in order to prevent electric field concentration.

The second modification example may be combined with the first modification example, and is similarly applicable to other embodiments other than the first embodiment.

Third Modification Example

Figure 28:
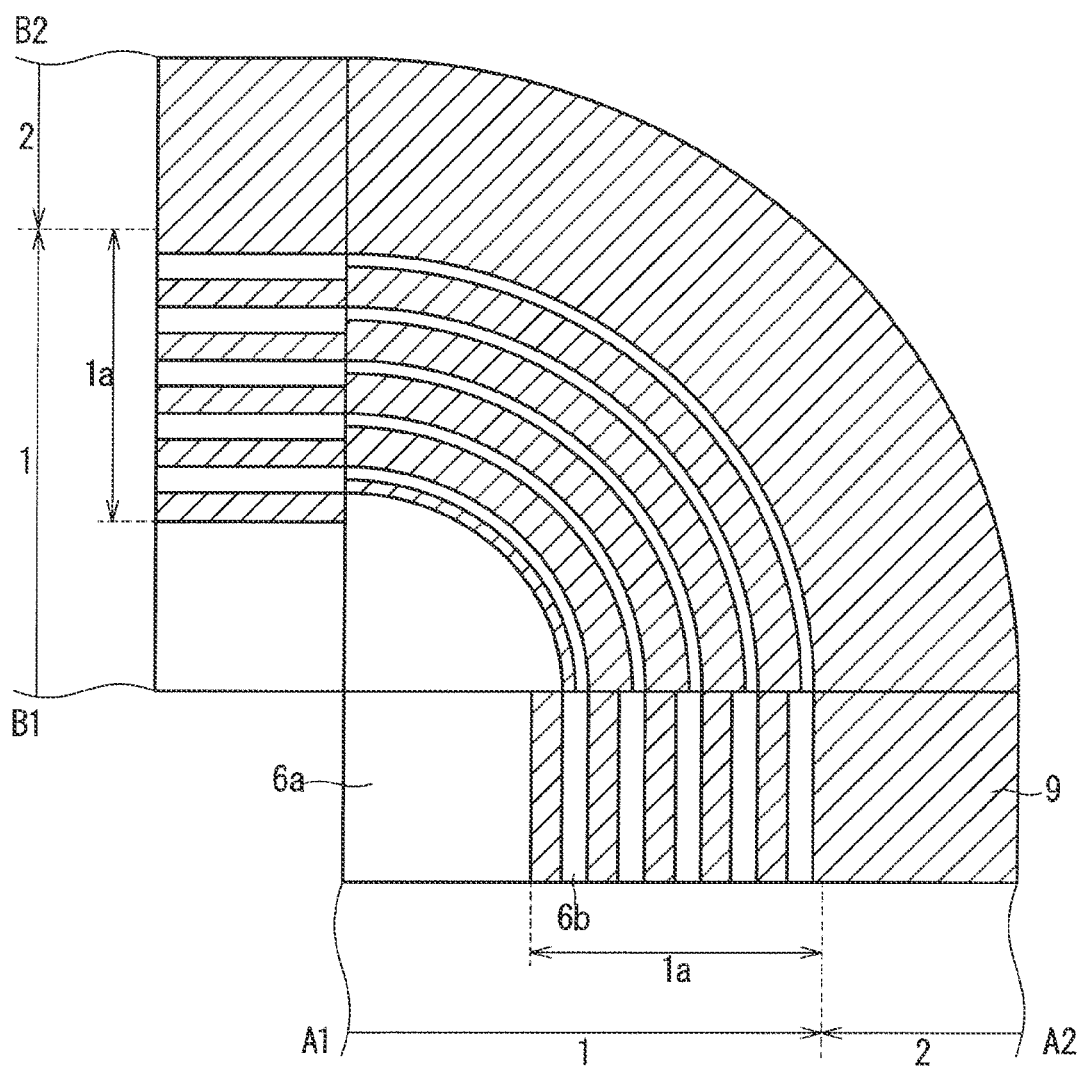
FIG. 28 is a plan view illustrating the configuration of the semiconductor device according to the third modification example of the first embodiment.

In a case where improvement in the recovery breakdown resistance as described in the second modification is not required, as illustrated in FIG. 28, the length of the ballast resistor section 1a is reduced so as to offset the increase in the resistance of the ballast resistor section 1a at the corner portions described in the second modification example, That is, designing the pattern so that the increased resistance at the corner portion is reduced by the same amount, allows the area of the first opening 6a to inevitably increase, improving the conduction property of the semiconductor device.

Although FIG. 28 illustrates a schematic diagram for ease of description, smoothing processing to smoothen the corners is actually required in order to prevent electric field concentration.

The third modification example may be combined with the first modification example, and is similarly applicable to other embodiments other than the first embodiment.

Second Embodiment

Figure 29:
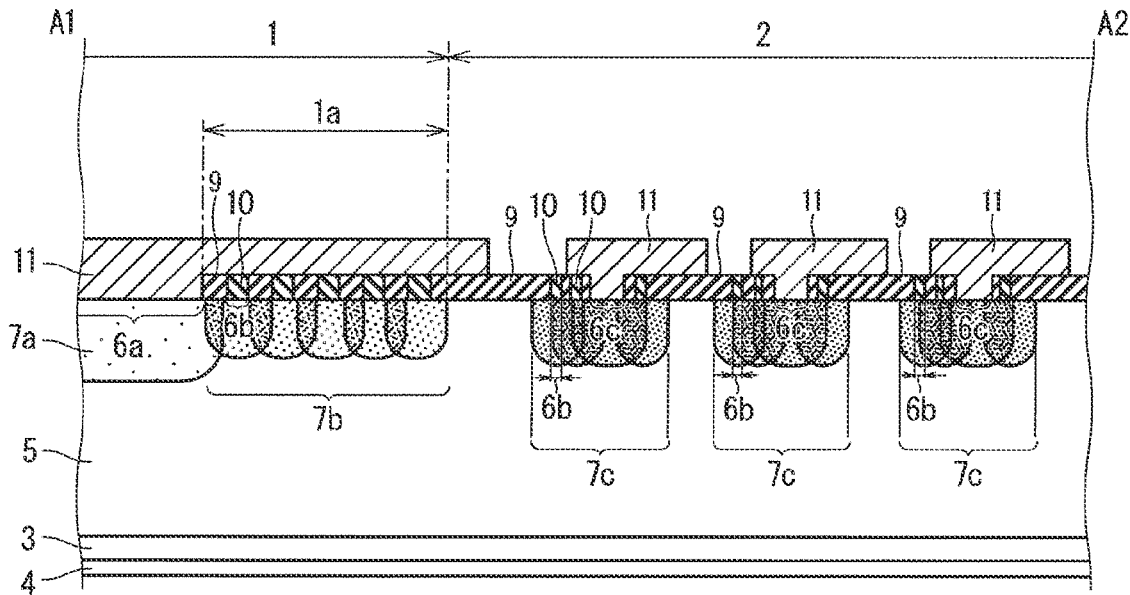
FIG. 29 is a cross-sectional view illustrating a configuration of a semiconductor device according to a second embodiment.

FIG. 29 is a cross-sectional view illustrating a configuration of a semiconductor device according to a second embodiment. The cross-sectional view illustrated in FIG. 29 corresponds to the cross-sectional view illustrated in FIG. 14, Hereinafter, among the components of the semiconductor device according to the second embodiment, the same or similar components as those described above are denoted by the same or similar reference numerals, and different components will be mainly described.

As illustrated in FIG. 29, the semiconductor device according to the second embodiment differs from the semiconductor device according to the first embodiment (see FIG. 14) in the termination section 2.

In the termination section 2, a multiple diffusion layer ring 7c, which is a third impurity layer of P-type, is arranged, and the multiple diffusion layer ring 7c constitutes a Field Limiting Ring (FLR). The concept of the multiple diffusion layer ring 7c is the same as the multiple diffusion layers 7b. A second opening 6b in contact with the multiple diffusion layer ring 7c is filled with a second insulating film 10, and the front surface electrode 11 connected to the multiple diffusion layer ring 7c and the semiconductor substrate 5 are electrically insulated by the second insulating film 10. Also, the front surface electrode 11 in the termination section 2 is in contact with the multiple diffusion layer ring 7c through the third opening 6c. With such a configuration, the field plate of the front surface electrode 11 can be formed, and the breakdown voltage of the semiconductor device can be improved.

The manufacturing flow of the semiconductor device according to the second embodiment is the same as the manufacturing flow illustrated in FIGS. 16 to 23 in the first embodiment, and the semiconductor device according to the second embodiment can be manufactured using a dedicated mask for forming the multiple diffusion layer rings 7c illustrated in FIG. 29 in the manufacturing flow. As a result, in addition to the effect of the first embodiment, the dedicated mask for forming the termination section 2 and one set of the dedicated processes of photomechanical process, processing, impurity doping, and diffusion can be omitted.

Third Embodiment

Figure 30:
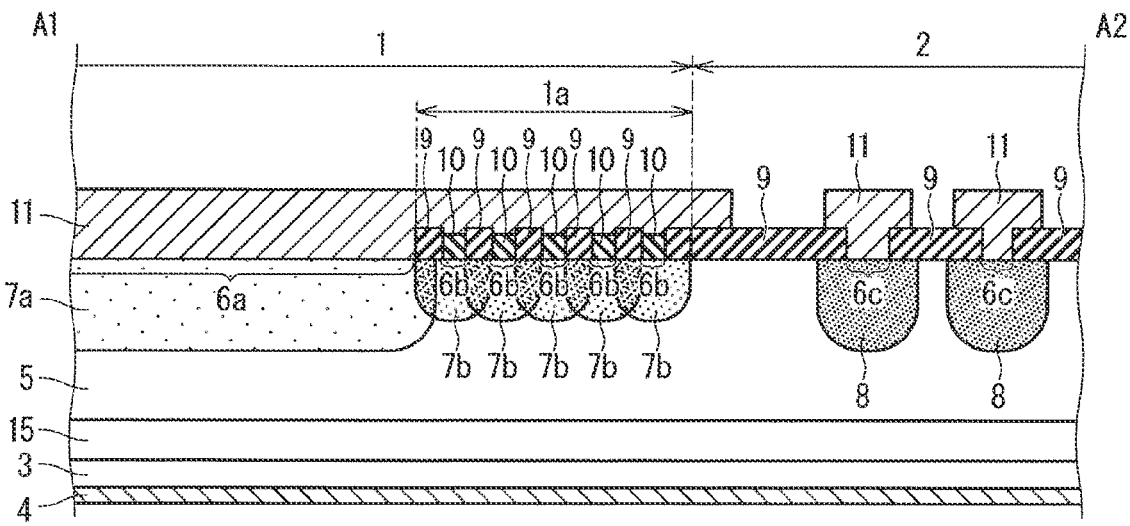
FIG. 30 is a cross-sectional view illustrating a configuration of a semiconductor device according to a third embodiment.

FIG. 30 is a cross-sectional view illustrating a configuration of a semiconductor device according to a third embodiment. The cross-sectional view illustrated in FIG. 30 corresponds to the cross-sectional view illustrated in FIG. 14. Hereinafter, among the components of the semiconductor device according to the third embodiment, the same or similar components as those described above are denoted by the same or similar reference numerals, and different components will be mainly described.

As illustrated in FIG. 30, the semiconductor device according to the third embodiment has a configuration in which an N-buffer layer 15, which is a buffer layer of N-type, is added to the semiconductor device according to the first embodiment (see FIG. 14).

The N-buffer layer 15 is arranged on the back surface of the semiconductor substrate 5, in contact with the N+ layer 3, which is a fourth impurity layer of N-type, and closer to the front surface than the N+ layer 3 is. The N-buffer layer 15 is formed by, for example, implantation by proton irradiation or N-type impurity diffusion.

According to the semiconductor device according to the third embodiment, the increase in the electric field in the semiconductor device during the recovery operation is suppressed, that is, the recovery breakdown resistance of the semiconductor device is enhanced.

The manufacturing flow of the semiconductor device according to the third embodiment is the same as the manufacturing flow illustrated in FIGS. 16 to 23 in the first embodiment, and the N-buffer layer 15 is formed in a subsequent step.

Fourth Embodiment

Figure 31:
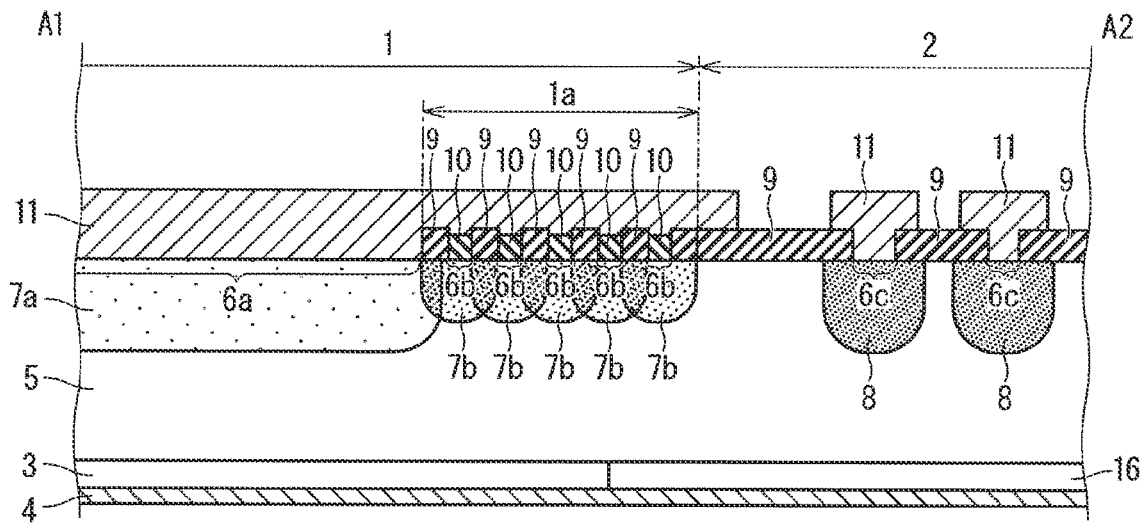
FIG. 31 is a cross-sectional view illustrating a configuration of a semiconductor device according to a fourth embodiment.

FIG. 31 is a cross-sectional view illustrating a configuration of a semiconductor device according to a fourth embodiment. The cross-sectional view illustrated in FIG. 31 corresponds to the cross-sectional view illustrated in FIG. 14, Hereinafter, among the components of the semiconductor device according to the fourth embodiment, the same or similar components as those described above are denoted by the same or similar reference numerals, and different components will be mainly described.

As illustrated in FIG. 31, the semiconductor device according to the fourth embodiment has a configuration in which a P+ layer 16, which is a fifth impurity layer of P-type, is added to the semiconductor device according to the first embodiment (see FIG. 14).

The P+ layer 16 is arranged on the back surface side of the semiconductor substrate 5 in a region corresponding to the termination section 2, and partially extends into the ballast resistor section 1*a*. In addition, the P+ layer 16 is adjacent to the N+ layer 3, which is a fourth impurity layer of N-type.

According to the semiconductor device according to the fourth embodiment, a current flowing from the termination section 2 toward the anode layer 7*a* is suppressed in the semiconductor device during recovery operation, that is, the recovery breakdown resistance of the semiconductor device is enhanced.

The manufacturing flow of the semiconductor device according to the fourth embodiment is the same as the manufacturing flow illustrated in FIGS. 16 to 23 in the first embodiment, and the layer 16 is formed in a subsequent step.

Fifth Embodiment

Figure 32:
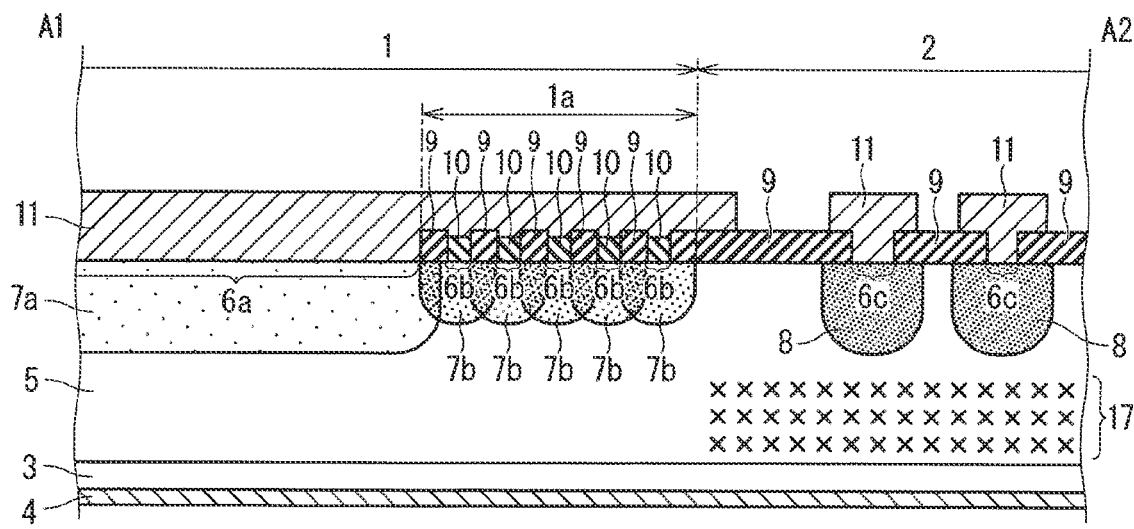
FIG. 32 is a cross-sectional view illustrating a configuration of a semiconductor device according to a fifth embodiment.

FIG. 32 is a cross-sectional view illustrating a configuration of a semiconductor device according to a fifth embodiment. The cross-sectional view illustrated in FIG. 32 corresponds to the cross-sectional view illustrated in FIG. 14. Hereinafter, among the components of the semiconductor device according to the fifth embodiment, the same or similar components as those described above are denoted by the same or similar reference numerals, and different components will be mainly described.

As illustrated in FIG. 32, the semiconductor device according to the fifth embodiment has a configuration in which a lifetime killer level 17 is added to the semiconductor device according to the first embodiment (see FIG. 14). Specifically, the semiconductor substrate 5 has the lifetime killer level 17 at the termination section 2. The lifetime killer level 17 is formed by, for example, electron beam irradiation, implantation by proton irradiation, and heavy metal diffusion.

According to the semiconductor device according to the fifth embodiment, the lifetime killer level 17 can reduce the carrier concentration in the termination section 2. Accordingly, a current flowing from the termination section 2 toward the anode layer 7*a* is further suppressed in the semiconductor device during recovery operation, that is, the recovery breakdown resistance of the semiconductor device is enhanced.

The manufacturing flow of the semiconductor device according to the fifth embodiment is the same as the manufacturing flow illustrated in FIGS. 16 to 23 in the first embodiment, and the lifetime killer level 17 is formed in a subsequent step.

In the present disclosure, the embodiments can be combined, appropriately modified or omitted, without departing from the scope of the disclosure.

The foregoing description is in all aspects illustrative and not restrictive, and it is therefore understood that numerous modifications can be devised. For example, changing, adding or omitting any components, and taking at least one component from at least one embodiment and combining it with components of an other embodiment may also be conceivable.

In addition, so far as consistency is maintained, "one" unit of component described and provided in each embodiment above may also be "one or more" units of components to be provided. Further, the components constituting the technique according to the present disclosure may be a conceptual unit, and one component may include a plurality of structures, and one component may be a part of a certain structure. Further, the components of the technique according to the present disclosure include structures having other structures or shapes as long as the same function is exhibited.

While the disclosure has been illustrated and described in detail, the foregoing description is in all aspects illustrative and not restrictive. It is therefore understood that numerous modification examples and variations can be devised without departing from the scope of the invention.

What is claimed is:

1. A semiconductor device comprising:
a semiconductor substrate of a first conductivity type, in which a cell region, a ballast resistor region which is a region being an outer edge of the cell region, and a termination region surrounding the ballast resistor region are defined;
a first insulating film arranged on a front surface of the semiconductor substrate, having a first opening in the cell region, and having at least one second opening in the ballast resistor region;
a second insulating film filled in the at least one second opening;
a first impurity layer of a second conductivity type arranged on the front surface of the semiconductor substrate below the first opening;
a second impurity layer of the second conductivity type arranged on the front surface of the semiconductor substrate below the at least one second opening; and
a conductive film arranged from the front surface of the first opening of the semiconductor substrate to the termination region.

2. The semiconductor device according to claim 1, wherein
a depth of the first impurity layer, a thickness of the second insulating film, an opening width of the second opening, arrangement intervals between each of the at least second opening when a plurality of the second openings exist, and a gap between the first opening and the at least one second opening are defined based on a thickness of the first insulating film.

3. The semiconductor device according to claim 1, wherein
a pattern of the at least one second opening is formed in a dot pattern in plan view.

4. The semiconductor device according to claim 1, wherein
in the at least one second opening, a width in a corner portion is different from a width in other portions in the semiconductor substrate, and
an area of the first opening does not change in both cases where, in the at least one second opening, the width in the corner portion is and is not different from the width in the other portions in the semiconductor substrate.

5. The semiconductor device according to claim 1, wherein
in the at least one second opening, a width in a corner portion is different from a width in other portions in the semiconductor substrate, and
an area of the first opening is greater than that in a case where, in the at least one second opening, the width in the corner portion is not different from the width in the other portions in the semiconductor substrate.

6. The semiconductor device according to claim 1, wherein the first insulating film has the at least one second opening and at least one third opening in the termination region, a third impurity layer of the second conductivity type arranged on the front surface of the semiconductor substrate below the at least one third opening, the second insulating film is filled in the at least one second opening, and the conductive film is in contact with the third impurity layer through the at least third opening.

7. The semiconductor device according to claim 1, further comprising:
   a buffer layer of the first conductivity type arranged on a back surface of the semiconductor substrate; and
   a fourth impurity layer of the first conductivity type arranged on the buffer layer.

8. The semiconductor device according to claim 1, further comprising:
   a fourth impurity layer of the first conductivity type arranged on the back surface of the semiconductor substrate; and
   a fifth impurity layer of the second conductivity type arranged in a portion of the back surface of the semiconductor substrate from the termination region to a portion of the ballast resistor region and is adjacent to the fourth impurity layer.

9. The semiconductor device according to claim 1, wherein
   the semiconductor substrate has a lifetime killer level in the termination region.

10. The semiconductor device according to claim 1, wherein
   the first insulating film has a plurality of second openings,
   a plurality of second impurity layers are arranged on the front surface of the plurality of second openings, and
   each of the plurality of second impurity layers are adjacent to each other and the second impurity layer closest to the first impurity layer among the plurality of second impurity layers is in contact with the first impurity layer.

11. The semiconductor device according to claim 1, wherein
   a pattern of the plurality of second openings is formed in a striped pattern in plan view.

12. A method of manufacturing a semiconductor device, comprising:
   preparing a semiconductor substrate of a first conductivity type, in which a cell region, a ballast resistor region which is a region being an outer edge of the cell region, and a termination region surrounding the ballast resistor region are defined;
   forming a first insulating film having a first opening in the cell region, and having at least one second opening in the ballast resistor region, on a front surface of the semiconductor substrate;
   implanting or depositing impurities of a second conductivity type in the semiconductor substrate through the first opening and the at least one second opening;
   forming a first impurity layer of the second conductivity type on the front surface of the semiconductor substrate below the first opening and forming a second impurity layer of the second conductivity type on the front surface of the semiconductor substrate blow the at least one second opening by activating the implanted or deposited impurities;
   filling a second insulating film in the at least one second opening; and
   forming a conductive film from the front surface of the first opening of the semiconductor substrate to the termination region.

* * * * *